(12) United States Patent
Brand et al.

(10) Patent No.: US 6,812,068 B2
(45) Date of Patent: Nov. 2, 2004

(54) SEMICONDUCTOR DEVICE ENCAPSULATORS, METHODS OF ENCAPSULATING SEMICONDUCTOR DEVICES AND METHODS OF FORMING ELECTRONIC PACKAGES

(75) Inventors: Joseph M. Brand, Boise, ID (US); Scott Gooch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/135,932

(22) Filed: Apr. 29, 2002

(65) Prior Publication Data

US 2002/0119604 A1 Aug. 29, 2002

Related U.S. Application Data

(63) Continuation of application No. 09/146,118, filed on Sep. 2, 1998, now Pat. No. 6,399,425.

(51) Int. Cl.⁷ .......................... H01L 21/48; H01R 43/00
(52) U.S. Cl. .......................... 438/126; 438/127; 29/841; 29/855
(58) Field of Search .................. 438/106, 110, 438/112, 108, 124, 126, 127, 367, 379, 384; 257/678, 787, 788, 790; 29/841, 854, 855; 222/1

(56) References Cited

U.S. PATENT DOCUMENTS

| | | | |
|---|---|---|---|
| 4,600,601 A | 7/1986 | Tamura | |
| 4,695,482 A | 9/1987 | Weiswurm | |
| 4,803,124 A | 2/1989 | Kunz | |
| 4,874,444 A | 10/1989 | Satou et al. | 156/64 |
| 4,989,758 A | 2/1991 | Keller | 222/137 |
| 5,128,746 A | 7/1992 | Pennisi et al. | 257/738 |
| 5,136,365 A | 8/1992 | Pennisi et al. | 257/783 |

(List continued on next page.)

FOREIGN PATENT DOCUMENTS

| | | | | |
|---|---|---|---|---|
| EP | 662 723 A1 | 5/1994 | | |
| JP | 56009043 | 1/1981 | | |
| JP | 60047430 A | * 3/1985 | ........... | H01L/21/56 |
| JP | 63143849 A | * 6/1988 | ........... | H01L/23/28 |
| JP | 5 121483 | 10/1991 | | |
| JP | 03280554 | 12/1991 | | |
| JP | 08186134 | 7/1996 | | |
| JP | 08186134 A | * 7/1996 | ........... | H01L/21/52 |
| JP | 61171564 | 8/1996 | | |
| JP | 10321656 A | * 12/1998 | ........... | H01L/21/56 |
| JP | 2000340715 A | * 12/2000 | ........... | H01L/23/13 |

OTHER PUBLICATIONS

ARTICLE: "Matching Fluid Dispensers To Materials For Electronics Applications", Electronic Packaging & Production, Jul. 1997, pp. 56–62.

BROCHURE: "Encapsulation", Camelot Systems, Inc., Feb. 1995, 2 sheets.

Primary Examiner—Alonzo Chambliss
(74) Attorney, Agent, or Firm—Wells St. John P.S.

(57) ABSTRACT

In one aspect, the invention includes a method of encapsulating a semiconductor device, comprising: a) providing a semiconductor device; b) providing a dispensing apparatus having a plurality of dispensing orifices proximate the semiconductor device; and c) dispensing a liquid encapsulating material through the plurality of orifices and over the semiconductor device. In another aspect, the invention includes a method of forming an electronic package, comprising: a) providing a circuit board having a circuit pattern; b) joining a plurality of semiconductor devices to the circuit board in electrical connection with the circuit pattern; c) providing a dispensing apparatus having a plurality of dispensing orifices proximate the semiconductor devices; d) simultaneously dispensing liquid encapsulating material through at least two of the plurality of orifices and over at least two of the semiconductor devices; and e) curing the liquid encapsulating material.

19 Claims, 6 Drawing Sheets

U.S. PATENT DOCUMENTS

| | | | |
|---|---|---|---|
| 5,187,123 A | 2/1993 | Yoshida et al. | |
| 5,266,349 A | 11/1993 | Bok | |
| 5,313,365 A | 5/1994 | Pennisi et al. | 361/760 |
| 5,423,889 A | 6/1995 | Colquitt et al. | 29/25.01 |
| 5,496,775 A | 3/1996 | Brooks | 438/127 |
| 5,557,142 A | 9/1996 | Gilmore et al. | 257/659 |
| 5,564,606 A | 10/1996 | Engel | 222/261 |
| 5,696,033 A | 12/1997 | Kinsman | 438/123 |
| 5,789,803 A | 8/1998 | Kinsman | 257/666 |
| 5,795,390 A | 8/1998 | Cavallaro | 118/314 |
| 5,819,983 A | 10/1998 | White et al. | 222/1 |
| 5,878,957 A | 3/1999 | Takado et al. | 239/71 |
| 5,942,035 A | 8/1999 | Hasebe et al. | |
| 5,971,227 A | 10/1999 | White et al. | 222/333 |
| 5,981,314 A * | 11/1999 | Glenn et al. | 438/127 |
| 6,017,392 A | 1/2000 | Cavallaro | 118/314 |
| 6,046,076 A * | 4/2000 | Mitchell et al. | 438/127 |
| 6,082,289 A | 7/2000 | Cavallaro | 118/300 |
| 6,126,428 A * | 10/2000 | Mitchell et al. | 425/110 |
| 6,177,288 B1 | 1/2001 | Takiar | 438/15 |
| 6,200,386 B1 | 3/2001 | Canella | |
| 6,213,347 B1 * | 4/2001 | Thomas | 222/52 |
| 6,228,679 B1 * | 5/2001 | Chiu | 438/108 |
| 6,245,583 B1 | 6/2001 | Amador et al. | |
| 6,340,846 B1 * | 1/2002 | LoBianco et al. | 257/783 |
| 6,383,292 B1 * | 5/2002 | Brand et al. | 118/315 |
| 6,399,004 B1 * | 6/2002 | Slager | 264/254 |
| 2001/0000754 A1 * | 5/2001 | Nakazawa et al. | 438/106 |

* cited by examiner

SEMICONDUCTOR DEVICE ENCAPSULATORS, METHODS OF ENCAPSULATING SEMICONDUCTOR DEVICES AND METHODS OF FORMING ELECTRONIC PACKAGES

RELATED PATENT DATA

This application resulted from a Continuation of U.S. patent application Ser. No. 09/146,118, filed Sep. 2, 1998, now U.S. Pat. No. 6,399,425 entitled "Method of Encapsulating Semiconductor Devices Utilizing a Dispensing Apparatus with Rotating Orifices", naming Joseph M. Brand and Scott Gooch as inventors.

TECHNICAL FIELD

The invention pertains to methods of encapsulating semiconductor devices, such as, for example, methods of forming electronic packages, as well as to encapsulator devices.

BACKGROUND OF THE INVENTION

Semiconductor chips are frequently connected to a circuit board and subsequently encapsulated within a sealant compound to form a sealed package during semiconductor device manufacture. Among the methods that can be utilized for connecting chips to circuit boards are, for example, wire bonding, flip chip, chip on board, and tape automated bonding. All four methods can be followed by the application and curing of one or more liquid encapsulants over the chips and nearby circuitry. The cured encapsulants can protect the chips and their associated electronic interconnections to the boards from physical damage and ionic contamination.

The liquid encapsulants are typically applied by dispensing the encapsulants to form a glob over one or more chips and their associated electrical interconnections. Hence, the technology of providing such encapsulants is frequently referred to by the term "glob-top" encapsulation. The encapsulants can be provided as single globs over single chips (so-called "single chip modules"), or as single globs encompassing multi-chip units (so-called "multi-chip modules").

Glob-top encapsulation was originally introduced for consumer packages such as, for example, video games, but the demand for miniaturized circuitry led to the use of glob-top as a preferred assembly method for many types of products including, for example, smart credit cards, and microprocessor circuitry. Glob-top encapsulation technology can enable manufacturers to make relatively thin devices, and also enables many companies to produce packages with cost equal to or less than conventional plastic packages. Typical glob-top compositions include epoxy or silicone encapsulating resins which provide protection against corrosion, vibration and mechanical stresses.

An exemplary automated process for applying a glob-top encapsulant to a chip is as follows. First, an integrated circuit chip is provided on a circuit board. The chip has exposed electrical leads (or pads) provided in electrical contact with corresponding leads (or pads) on the circuit board. The electrical connection can comprise, for example, a wire bond comprising exposed gold wires connecting the leads of the chip with those of the circuit board. Next, encapsulant is pumped through a single syringe to form a glob over the chip and over the electrical connections of the chip to the circuit board. Typically, the single syringe is moved relative to the chip as the encapsulant is provided. In one method, the syringe is first moved to dispense encapsulant around a periphery of the chip and form a dam of encapsulant material. The syringe is then moved over a center of the chip to provide encapsulant onto the chip. The encapsulant provided onto the chip is prevented from flowing beyond the periphery of the chip by the dam that was initially provided. The encapsulant utilized for the dam can be different than that provided over a center of the chip. Specifically, the encapsulant utilized for forming the dam can be a so-called "dam" encapsulant and that provided over the center of the chip can be a so-called "fill" encapsulant. Dam encapsulants are generally more viscous than fill encapsulants. After the encapsulant is provided, it is cured by, for example, thermal processing to solidify the encapsulant material.

A continuing goal in semiconductor processing is to increase speed of semiconductor device fabrication. Accordingly, it would be desirable to increase the speed with which chips are encapsulated.

SUMMARY OF THE INVENTION

In one aspect, the invention encompasses a method of encapsulating a semiconductor device. A semiconductor device is provided. A dispensing apparatus is provided proximate the semiconductor device. The dispensing apparatus has a plurality of orifices. A liquid encapsulating material is dispensed through the plurality of orifices and over the semiconductor device.

In another aspect, the invention encompasses a method of forming an electronic package. A circuit board comprising a circuit pattern is electrically connected with a semiconductor device. A dispensing apparatus is provided proximate the semiconductor device. The dispensing apparatus has a plurality of dispensing orifices. A liquid encapsulating material is dispensed through the plurality of orifices and onto the semiconductor device. The encapsulating material is then cured.

In yet another aspect, the invention encompasses a semiconductor device encapsulator comprising a vessel configured for containing liquid encapsulant material, and a liquid dispensing apparatus in fluid communication with the vessel. The apparatus has a plurality of dispensing orifices. At least one of the dispensing orifices is configured for receipt over and within lateral confines of a semiconductor device being encapsulated.

BRIEF DESCRIPTION OF THE DRAWINGS

Preferred embodiments of the invention are described below with reference to the following accompanying drawings.

FIG. 1 is a diagrammatic, perspective view of a preliminary step of a method of encapsulating semiconductor chips in accordance with the present invention. FIG. 1 illustrates a circuit board and an encapsulating material dispensing device.

FIG. 8 is a diagrammatic, perspective view of a preliminary step of a second embodiment method of encapsulating semiconductor chips in accordance with the present invention. FIG. 8 illustrates a circuit board and a second embodiment encapsulating material dispensing device.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
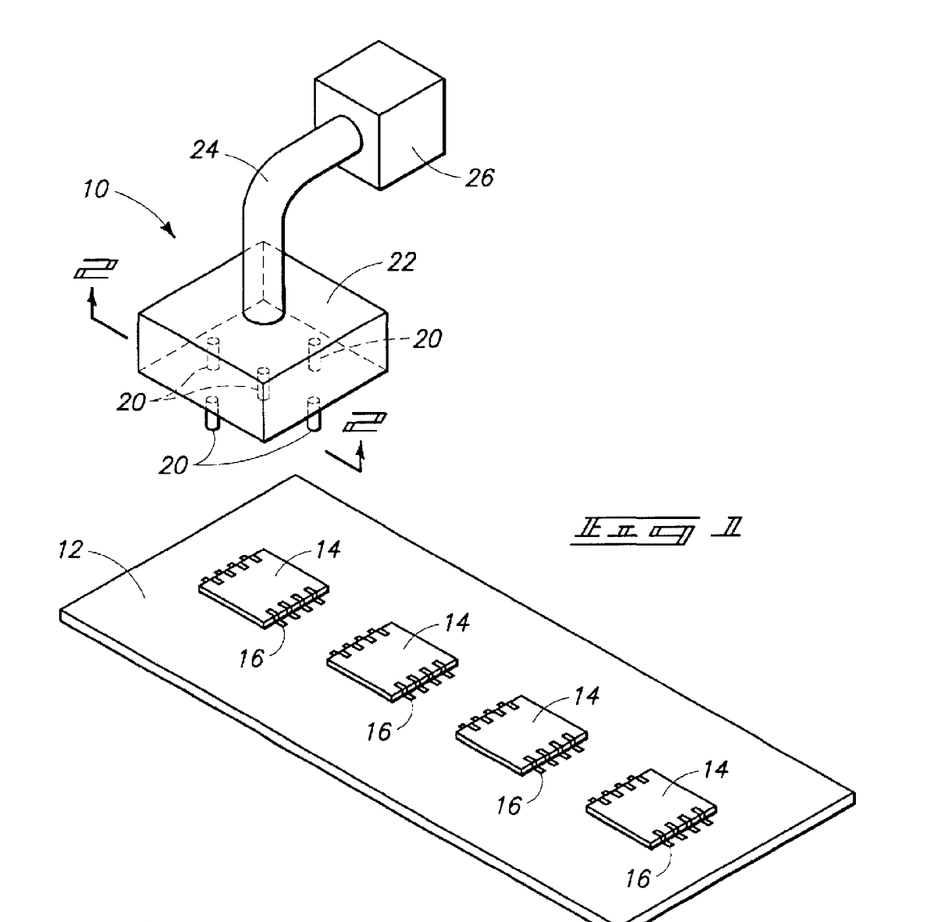

An encapsulant forming apparatus (encapsulator) 10 encompassed by the present invention is described with reference to FIG. 1. FIG. 1 illustrates apparatus 10 positioned relative to a circuit board 12 having semiconductor devices 14 positioned thereon. Semiconductor devices 14 can comprise, for example, integrated circuit chips. Semiconductor devices 14 are in electrical connection with a circuit (not shown) provided on or within circuit board 12. In the shown embodiment, the electrical interconnection comprises wire bonding. Specifically, the interconnection comprises wires 16 (only some of which are labeled) which electrically connect nodes (not shown) provided on or within semiconductor devices 14 with nodes (not shown) provided on or within circuit board 12. Wires 16 can comprise, for example, thin gold wires.

Apparatus 10 comprises a plurality of orifices 20 connected to a orifice support 22. Orifices 20 can comprise, for example, nozzles. Orifices 20 are in fluid connection with an inlet 24, which in turn is in fluid connection with a liquid encapsulant source 26. Inlet 24 can comprise, for example, tubing that is chemically inert relative to the liquid encapsulant material flowed through inlet 24. Source 26 can comprise a vessel configured to contain a liquid encapsulant material. In operation, liquid encapsulant is flowed from source 26, through inlet 24, and out of orifices 20. The flow of liquid encapsulant material can be powered by conventional methods, such as, for example, a pump (not shown) provided between source 26 and inlet 24. Additionally, valves can be provided between orifices 20 and source 26 to control flow of material out of orifices 20. In the shown embodiment, all of orifices 20 are connected to a common source 26. It is to be understood, however, that the invention encompasses alternative embodiments wherein one or more of orifices 20 are connected to a different encapsulant source than are others of orifices 20. Utilization of different encapsulant sources can enable different encapsulants to be flowed through different orifices. Apparatus 10 can further comprise a table (not shown) configured to retain circuit board 12 in precise alignment with orifices 20.

Figure 2:
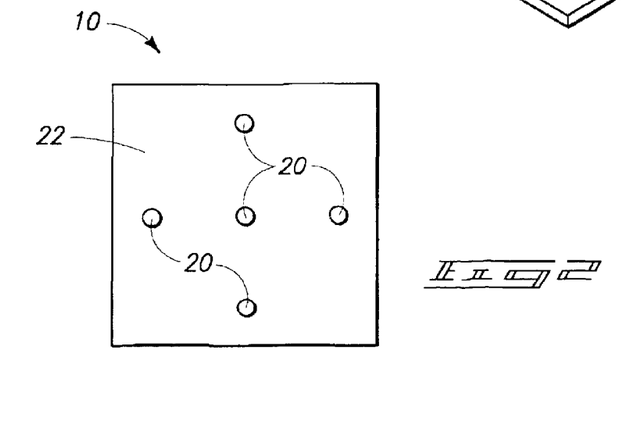
FIG. 2 is a view of the FIG. 1 encapsulating material dispensing device shown along the line 2—2 of FIG. 1.

FIG. 2 is a view of apparatus 10 along the line 2—2 of FIG. 1. FIG. 2 illustrates a preferred embodiment of apparatus 10 comprising five outlet orifices 20. One of outlet orifices 20 is interiorly located relative to the remaining four outlet orifices 20. Such interiorly located outlet orifice 20 will provide encapsulant onto a semiconductor device 14, while the remaining outlet orifices 20 provide encapsulant around a periphery of semiconductor device 14. Such is illustrated in FIG. 3, wherein a fragment of circuit board 12 is illustrated after dispensing of an encapsulant material 30 through orifices 20 (FIG. 2).

Figure 3:
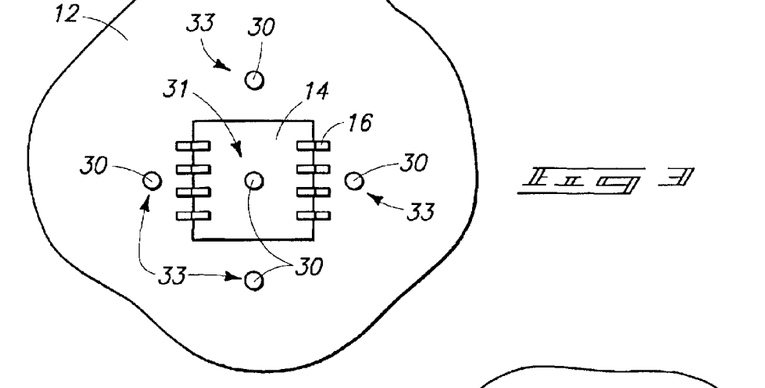
FIG. 3 is a fragmentary, exploded top view of a portion of the FIG. 1 circuit board shown at a processing step subsequent to that of FIG. 1.

The encapsulant material 30 in FIG. 3 is provided as a series of five drops in locations corresponding to the locations of outlet orifices 20 of FIG. 2. Such five drops comprise a single drop 31 interiorly located on semiconductor device 14, and four drops 33 around a periphery of device 14. Drop 31 is from the interiorly located dispensing orifice 20 received over and within lateral confines of the semiconductor device 14 being encapsulated. Drops 33 are from dispensing orifices 20 received outside of lateral confines of the semiconductor device 14 being encapsulated.

The five separate drops of encapsulant material 30 can be formed, for example, by simultaneously dispensing encapsulant material 30 through all five of orifices 20 (FIG. 2). Alternatively, the five drops can be formed sequentially by dispensing encapsulant material non-simultaneously through orifices 20. For instance, drops 33 at the periphery of device 14 can be dispensed first to form a dam around device 14, and subsequently interiorly located drop 31 can be dispensed over device 14.

Figure 4:
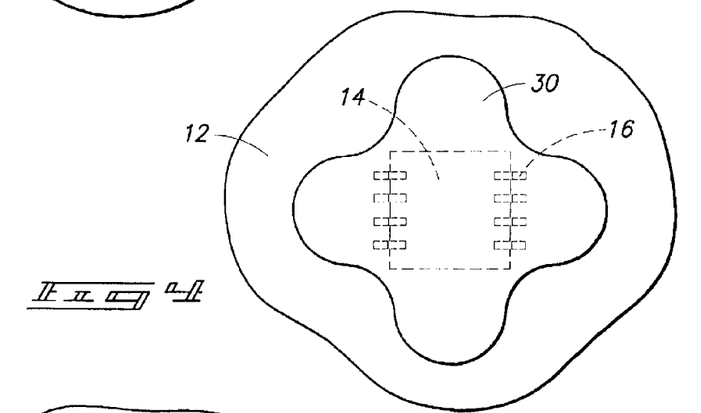
FIG. 4 is a view of the FIG. 3 fragment shown at a processing step subsequent to that of FIG. 3.

Referring to FIG. 4, the wafer fragment of FIG. 3 is illustrated after further dispensing of liquid encapsulant material 30 from orifices 20. Liquid encapsulant 30 now encapsulates an entirety of semiconductor device 14 (shown in phantom) and the wires 16 (shown in phantom). Encapsulant 30 thus forms a glob-top over semiconductor device 14. Encapsulant 30 can next be cured by, for example, thermal processing, to solidify encapsulant 30 into a protective coating adhered over semiconductor device 14 and wires 16.

Figure 5:
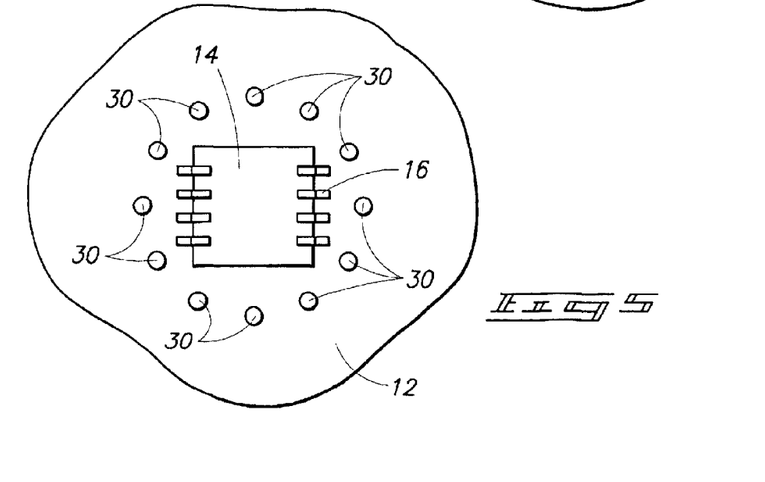
FIG. 5 is an exploded, fragmentary, top view of a portion of the FIG. 1 circuit board processed according to an alternative method of the present invention.

FIG. 5 illustrates an alternative method of the present invention wherein encapsulant 30 is distributed about a periphery of semiconductor device 14 prior to dispensing encapsulant 30 onto a central region of semiconductor device 14. The dispense pattern of FIG. 5 can be formed by, for example, utilizing the orifice arrangement of FIG. 2 and rotating either support structure 22, circuit board 12, or both as encapsulant material is dispensed from the peripherally located orifices 20. Alternatively, the dispense pattern of FIG. 5 can be formed by utilizing an apparatus 10 having a different orifice arrangement than that illustrated in FIG. 2. Such different orifice arrangement could, for example, correspond to a plurality of orifices arranged in a pattern corresponding to that of the dispensed encapsulant shown in FIG. 5.

Figure 6:
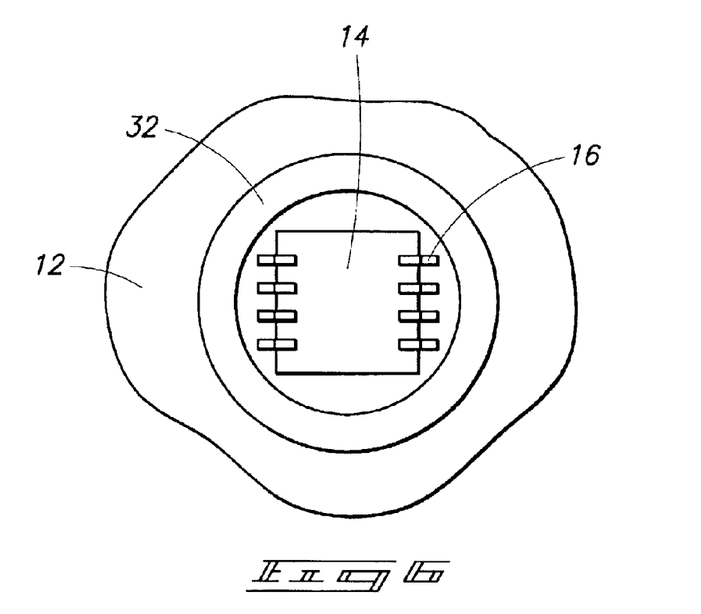
FIG. 6 is a view of the FIG. 5 fragment shown at a processing step subsequent to that of FIG. 5.

Referring to FIG. 6, the wafer fragment of FIG. 5 is illustrated after provision of sufficient encapsulant to form a dam 32 around semiconductor device 14.

Figure 7:
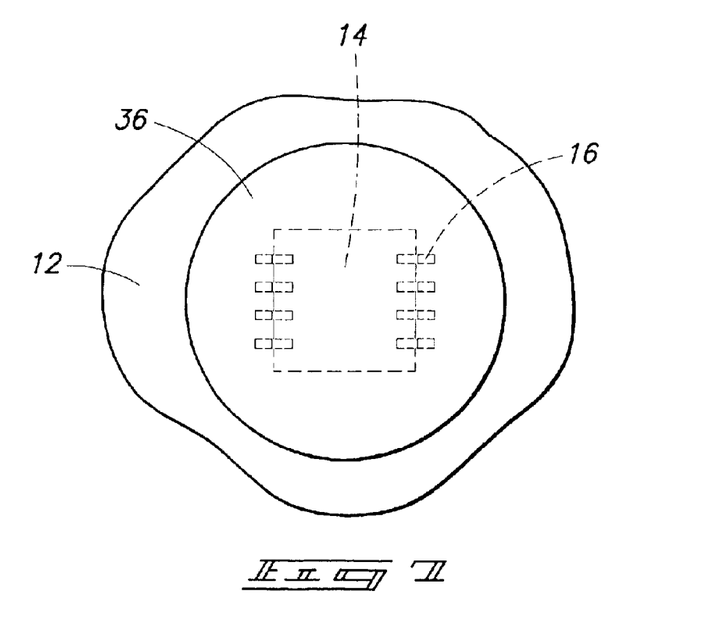
FIG. 7 is a view of the FIG. 5 fragment shown at a processing step subsequent to that of FIG. 6.

Referring to FIG. 7, the circuit board fragment of FIG. 6 is shown after provision of an encapsulant material within a center of dam 32 (FIG. 6) to overlay semiconductor device 14 (shown in phantom). The encapsulant provided to overlay device 14 can be dispensed from one or more interiorly located orifices of an encapsulant dispensing device analogous to the device 10 of FIGS. 1 and 2. The encapsulant provided within the center of dam 32 can comprise the same encapsulant material as that utilized for forming dam 32, or a different material. Utilization of a different material can enable the material of dam 32 to have a different viscosity than that utilized to overlay semiconductor device 14. For instance, the material utilized for dam 32 can be a so-called "dam" encapsulant and that utilized over device 14 can be a so-called "fill" encapsulant.

After provision of encapsulant material over device 14, a glob 36 comprising the encapsulant material over device 14 and the material of dam 32 (FIG. 6) is formed to encapsulate device 14 and the wires 16 extending to device 14. The encapsulated semiconductor device 14 and circuit board 12 together comprise an electronic package.

A second embodiment encapsulant dispensing apparatus 50 is described with reference to FIG. 8. Apparatus 50 comprises four spaced sets (52, 54, 56 and 58) of dispensing orifices (52a, 54a, 56a and 58a) configured as a linear array. Each of the orifice sets is in fluid communication with a liquid encapsulant source 60. Orifice sets 52, 54, 56 and 58 can comprise, for example, the orifice configuration described above with reference to the apparatus 10 of FIGS. 1 and 2. It is noted that the invention encompasses other embodiments (not shown) wherein the spaced orifice sets are replaced with spaced single orifices. Also, although each of the shown orifice sets comprises the same number and arrangements of orifices, the invention encompasses other embodiments (not shown) wherein some of the orifice sets comprise a different number and/or arrangement of orifices than other orifice sets.

Figure 8:
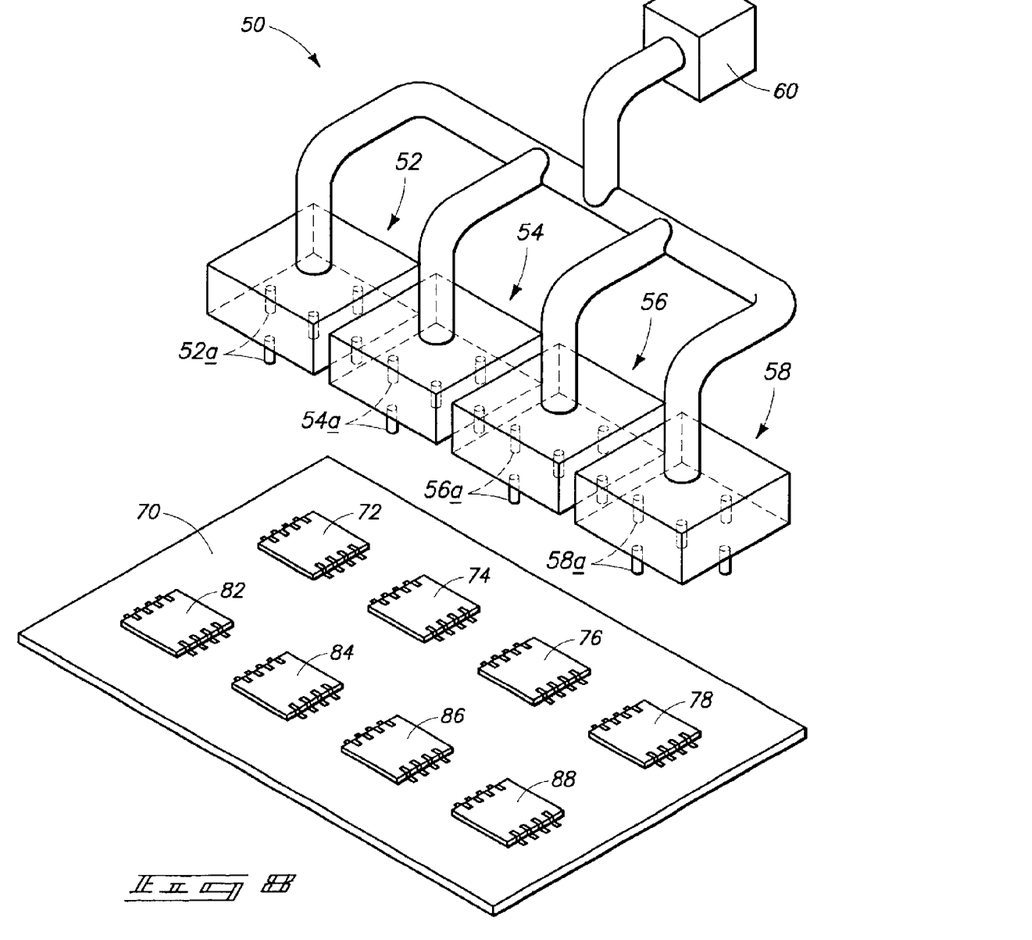

A circuit board 70 is shown in FIG. 8. Circuit board 70 comprises semiconductor devices 72, 74, 76, 78, 82, 84, 86 and 88. Semiconductor devices 72, 74, 76, and 78 form a first array of four devices, and semiconductor devices 82, 84, 86 and 88 form a second array of four devices. The array of dispensing orifice sets 52, 54, 56 and 58 is provided such that each of the individual orifice sets 52, 54, 56 and 58 is in correspondence with individual semiconductor devices of the first array of semiconductor devices. Specifically, orifice set 52 is in correspondence with semiconductor device 72, orifice set 54 is in correspondence with semiconductor device 74, orifice set 56 is in correspondence with semiconductor device 76, and orifice set 58 is in correspondence with semiconductor device 78.

Figure 9:
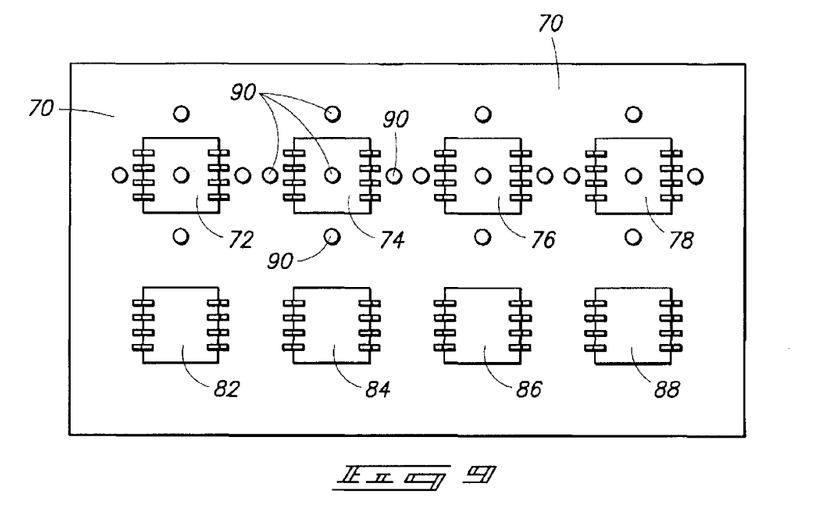
FIG. 9 is an exploded top view of a portion of the FIG. 8 circuit board shown at a processing step subsequent to that of FIG. 8.

FIG. 9 shows circuit board 70 after a liquid encapsulating material 90 is dispensed through the orifices of sets 52, 54, 56 and 58. Liquid encapsulant material 90 can be dispensed simultaneously through all of orifice sets 52, 54, 56 and 58, or sequentially through one or more of the sets. In the embodiment of FIG. 9, the encapsulant material is provided around a periphery of each of semiconductor devices 72, 74, 76 and 78, as well as over each of semiconductor devices 72, 74, 76 and 78. Such pattern is identical to that described above with reference to FIG. 3. Variations of the encapsulant dispensing can be conducted in accordance with variations discussed above with reference to FIGS. 3 and 5. Specifically, the encapsulant provided around the peripheries of one or more devices 72, 74, 76 and 78 can be provided prior to encapsulant being provided over one or more of devices 72, 74, 76 and 78, or after such provision. Also, one or more of orifices 52a, 54a, 56a and 58a can be moved relative to semiconductor devices 72, 74, 76 and 78 during dispensing of encapsulant material 90. Such moving can comprise either moving circuit board 70 during the dispensing, moving one or more of orifice sets 52, 54, 56 and 58 during the dispensing, or moving both circuit board 70 and one or more of orifice sets 52, 54, 56 and 58 during the dispensing.

Figure 10:
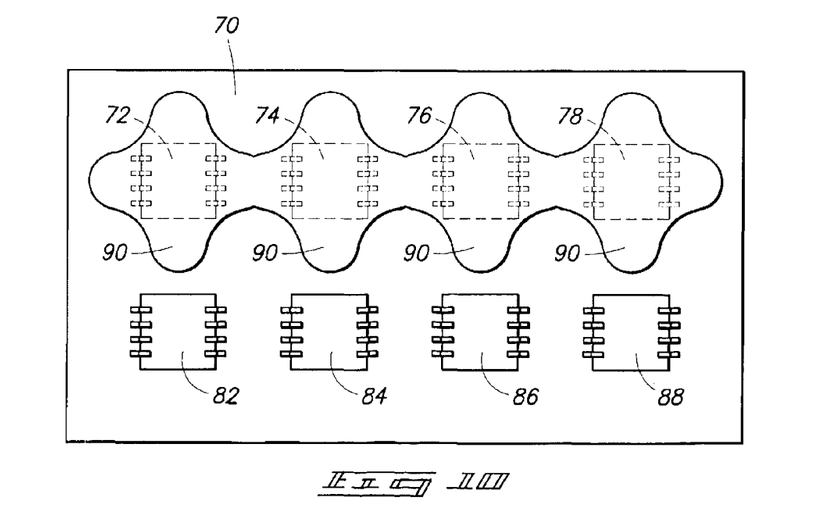
FIG. 10 is a view of the FIG. 9 circuit board shown at a processing step subsequent to that of FIG. 9.

Referring to FIG. 10, additional encapsulant 90 is provided relative to semiconductor wafer 72, 74, 76 and 78 (shown in phantom) to form globs of encapsulant which entirely encapsulate semiconductor devices 72, 74, 76 and 78.

Figure 11:
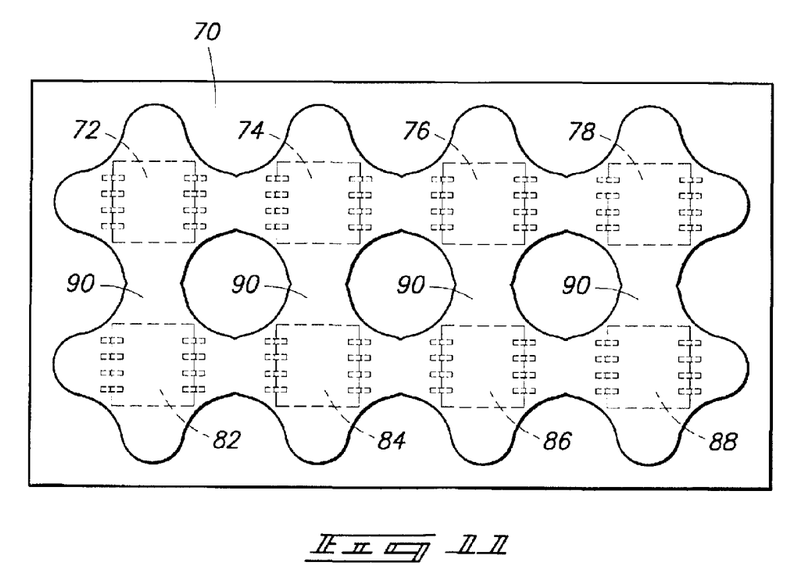
FIG. 11 is a view of the FIG. 9 circuit board shown at a processing step subsequent to that of FIG. 10.

Referring to FIG. 11, the array of orifice sets 52, 54, 56 and 58 (FIG. 8) is moved relative to circuit board 70 to align the array with semiconductor devices 82, 84, 86 and 88. Subsequently, encapsulant 90 is flowed over semiconductor devices 82, 84, 86 and 88 to form encapsulating globs over such devices. The movement of the array of orifice sets, 52, 54, 56 and 58 relative to circuit board 70 can comprise, for example, either moving orifice sets 52, 54, 56 and 58, moving circuit board 70, or moving both orifice sets 52, 54, 56 and 58 and circuit board 70.

In the shown embodiment of FIGS. 8–11, all of orifices 52a, 54a, 56a and 58a dispense a common encapsulant material. However, it is to be understood that the invention encompasses other embodiments (not shown) wherein one or more of orifices 52a, 54a, 56a and 58a dispense a different encapsulant from remaining orifices 52a, 54a, 56a and 58a. Such alternative embodiments can comprise, for example, utilizing a different encapsulant to form dams analogous to the dam 32 of FIG. 6 around one or more of semiconductive devices 72, 74, 76, 78, 82, 84, 86 and 88 prior to providing encapsulant on or over a center of such devices.

In the above-discussed embodiments, the semiconductor devices comprise rectangular shapes, and more specifically comprise square shapes. However, it is to be understood that the invention encompasses other embodiments wherein the semiconductor devices comprise other shapes. The configuration of orifices utilized to provide encapsulant relative to such other shaped semiconductor devices can be adapted to provide encapsulant both around a periphery of the devices and over the devices. Also, it is noted that although the above-described drawings illustrate dispensing of encapsulant at peripheries of semiconductor devices as well as over the devices, the invention encompasses other embodiments (not shown) where an encapsulant is dispensed only over a device, or only at a periphery of a device. In such other embodiments the encapsulant can be dispensed and then subsequently flowed from over the device to the periphery, or from the periphery to over the device, so that both the device and the interconnects at the device periphery are encapsulated.

In the embodiment shown in FIGS. 8–11, the array of orifice sets 52, 54, 56 and 58 is a linear array. However, the invention encompasses other embodiments (not shown) wherein the array is non-linear. For instance, the array could be a matrix. An exemplary matrix comprises eight orifice sets configured in four columns having two rows each.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of encapsulating a semiconductor device, comprising:
   providing an individual chip in electrical connection with a circuit associated with a substrate; and
   providing a plurality of drops of liquid encapsulating material over the substrate and spaced from the individual chip, the providing comprising distributing the drops simultaneously around a periphery of the individual chip to form a dam of encapsulating material around the individual chip.

2. The method of claim 1 wherein the providing comprises distributing the drops around an entirety of the periphery of the individual chip.

3. The method of claim 1 wherein the periphery of the semiconductor device comprises a number of sides, and wherein the providing comprises providing only one drop outward of and most proximate each side of the individual chip.

4. The method of claim 1 wherein the drops comprise a first set, and further comprising providing a second set of a plurality of drops over the substrate and spaced from the individual chip, and wherein the providing of the second set comprises distributing the drops around the periphery of the individual chip differently from the distribution of the first set.

5. The method of claim 4 wherein the providing of the second set of drops comprises distributing each drop of the second set simultaneously with each other drop of the second set, and wherein the providing of the second set collectively is provided simultaneously with the providing of the first set of drops.

6. The method of claim 4 wherein the providing of the second set of drops comprises distributing each drop of the second set simultaneously with each other drop of the second set, and wherein the providing of the second set collectively is provided after the providing of the first set of drops.

7. The method of claim 4 wherein the providing of the first and second sets of drops comprises positioning a dispensing apparatus elevationally above and proximate the individual chip, and wherein the providing of the second set comprises rotating at least one of the dispensing apparatus and the substrate.

8. The method of claim 7 wherein the providing of the second set of drops comprises rotating only the dispensing apparatus.

9. The method of claim 7 wherein the providing of the second set of drops comprises rotating only the substrate.

10. The method of claim 7 wherein the providing of the second set of drops comprises rotating the substrate and the dispensing apparatus.

11. A method of encapsulating a semiconductor device, comprising:

providing a semiconductor device over a substrate;

providing a first set of a plurality of drops of liquid encapsulating material over the substrate and spaced from the semiconductor device, the providing comprising distributing each drop of the first set simultaneously around a periphery of the semiconductor device;

providing a second set of a plurality of drops of liquid encapsulating material over the substrate and spaced from the semiconductor device, the providing of the second set comprising distributing each drop of the second set simultaneously with each other drop of the second set around the periphery of the semiconductor device wherein the distribution of the second set is different from the distribution of the first set; and providing a third set of a plurality of drops of liquid encapsulating material over the substrate and spaced from the semiconductor device, the providing of the third set comprising distributing each drop of the third set simultaneously with each other drop of the third set around the periphery of the semiconductor device wherein the distribution of the third set is different from the distribution of the first and second sets, the first, second and third set of drops together forming a dam of encapsulating material around the semiconductor device.

12. The method of claim 11 wherein the providing of the first, second and third sets comprises each set distributed simultaneously with the other sets.

13. The method of claim 11 wherein the providing of the first, second and third sets comprises each set distributed consecutively relative the other sets.

14. The method of claim 11 further comprising providing liquid encapsulating material over a central region of the semiconductor device after the providing of the first, second and third sets of drops.

15. A method of encapsulating semiconductor devices, comprising:

providing a plurality of semiconductor devices spaced in an array over a substrate; and providing a plurality of drops of liquid encapsulating material over the substrate and proximate each semiconductor device, the providing comprising distributing a set of drops for each semiconductor device spaced from and around a periphery of each semiconductor device, the set of drops forming a dam of encapsulating material around the semiconductor device.

16. The method of claim 15 wherein the distributing of each set of drops comprises distributing of each set simultaneously.

17. The method of claim 15 wherein the array comprises a first row of semiconductor devices and wherein the substrate comprises a plurality of other rows of semiconductor devices spaced from the first row.

18. The method of claim 15 further comprising providing a drop of liquid encapsulating material over a region within the periphery and over each semiconductor device.

19. The method of claim 18 wherein the providing of the plurality of drops over the substrate are provided simultaneously with the drop over each semiconductor device.

* * * * *

UNITED STATES PATENT AND TRADEMARK OFFICE
CERTIFICATE OF CORRECTION

PATENT NO.   : 6,812,068 B2
DATED        : November 2, 2004
INVENTOR(S)  : Brand et al.

It is certified that error appears in the above-identified patent and that said Letters Patent is hereby corrected as shown below:

Column 8,
Line 47, after "periphery" insert -- of --.

Signed and Sealed this

Thirty-first Day of May, 2005

JON W. DUDAS
*Director of the United States Patent and Trademark Office*